United States Patent
Shin (10) Patent No.: US 9,634,070 B2
(45) Date of Patent: Apr. 25, 2017

(54) ORGANIC LIGHT EMITTING DISPLAY DEVICE

(71) Applicant: Samsung Display Co., Ltd., Yongin, Gyeonggi-do (KR)

(72) Inventor: Hwang-Sup Shin, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 142 days.

(21) Appl. No.: 14/558,595

(22) Filed: Dec. 2, 2014

(65) Prior Publication Data

US 2015/0243715 A1  Aug. 27, 2015

(30) Foreign Application Priority Data

Feb. 25, 2014  (KR) .................. 10-2014-0021786

(51) Int. Cl.
*H01L 27/32* (2006.01)
*G09G 3/3233* (2016.01)

(52) U.S. Cl.
CPC ....... *H01L 27/3248* (2013.01); *G09G 3/3233* (2013.01); *H01L 27/3276* (2013.01);
(Continued)

(58) Field of Classification Search
CPC .... G09G 3/3233; G09G 3/3241; G09G 3/325; G09G 2300/0861; G09G 2300/0819;
(Continued)

(56) References Cited

U.S. PATENT DOCUMENTS

2005/0082969 A1* 4/2005 Tokuda ............... H01L 27/3276
                                                    313/506
2006/0001621 A1* 1/2006 Ono ..................... G09G 3/3233
                                                      345/76
(Continued)

FOREIGN PATENT DOCUMENTS

KR  10-2012-0002070 A     1/2012
KR  10-2012-0002071  *    1/2012 ............. H01L 27/32
(Continued)

OTHER PUBLICATIONS

Machine translation, Han, KR 10-2012-0002071, translation date: Jun. 14, 2016, KIPO, all pages.*

(Continued)

*Primary Examiner* — Victoria K Hall
(74) *Attorney, Agent, or Firm* — Lewis Roca Rothgerber Christie LLP (57) ABSTRACT

An organic light emitting display device includes: a display panel including scan lines, and pixels, a pixel of the pixels including: a driving transistor having a gate electrode; an insulator layer disposed on the gate electrode of the driving transistor; an electrode disposed on the insulator layer and coupled to the gate electrode of the driving transistor through a first contact hole; a first passivation layer disposed on the electrode; a first voltage line disposed on the first passivation layer and configured to supply a first voltage; a second passivation layer disposed on the first voltage line; and an organic light emitting diode (OLED) having an anode coupled to the driving transistor, wherein the anode is disposed on the second passivation layer, and wherein the first voltage line overlaps with the electrode and the anode.

14 Claims, 9 Drawing Sheets

(52) U.S. Cl.
CPC ............... *G09G 2300/0861* (2013.01); *G09G 2310/0251* (2013.01); *G09G 2310/0262* (2013.01)

(58) Field of Classification Search
CPC . G09G 2300/0043; G09G 2300/00426; G09G 2310/0251; G09G 2310/0262; H01L 27/3248; H01L 27/3276
USPC ............... 438/99; 257/40, E33.062, E33.065
See application file for complete search history.

(56) References Cited

U.S. PATENT DOCUMENTS

| | | | | |
|---|---|---|---|---|
| 2006/0071883 | A1* | 4/2006 | Oh ....................... | G09G 3/3233 345/76 |
| 2006/0208977 | A1* | 9/2006 | Kimura ................ | G09G 3/2014 345/76 |
| 2006/0208979 | A1* | 9/2006 | Fish ..................... | G09G 3/3233 345/81 |
| 2007/0064469 | A1* | 3/2007 | Umezaki ............... | G09G 3/325 365/154 |
| 2007/0126668 | A1* | 6/2007 | Kimura ................ | G09G 3/3283 345/76 |
| 2011/0001146 | A1* | 1/2011 | Yamazaki ............. | H05B 33/04 257/79 |
| 2011/0163382 | A1 | 7/2011 | Rotondaro | |
| 2011/0299004 | A1* | 12/2011 | Liu ..................... | H01L 27/1214 349/44 |
| 2012/0001893 | A1 | 1/2012 | Jeong et al. | |
| 2012/0001896 | A1 | 1/2012 | Han et al. | |
| 2012/0153293 | A1* | 6/2012 | Koyama .............. | G09G 3/3225 257/72 |
| 2015/0170563 | A1* | 6/2015 | Bang ...................... | H01L 27/32 257/40 |

FOREIGN PATENT DOCUMENTS

| | | |
|---|---|---|
| KR | 10-2012-0002071 A | 1/2012 |
| KR | 10-2012-0138924 A | 12/2012 |

OTHER PUBLICATIONS

Machine translation, Kim, KR 10-2012-0138924, translation date: Jun. 14, 2016, KIPO, all pages.*
Machine translation, Jeong, KR 10-2012-0002070, translation date: Jun. 14, 2016, KIPO, all pages.*

* cited by examiner

ORGANIC LIGHT EMITTING DISPLAY DEVICE

CROSS-REFERENCE TO RELATED APPLICATION

This application claims priority to and the benefit of Korean Patent Application No. 10-2014-0021786, filed on Feb. 25, 2014, in the Korean Intellectual Property Office, the entire contents of which are incorporated herein by reference.

BACKGROUND

1. Field

Aspects of embodiments of the present invention relate to an organic light emitting display device.

2. Description of the Related Art

With the development of an information-driven society, the demand for various types of display devices for displaying an image is increasing. Various flat panel displays such as liquid crystal displays (LCDs), plasma display panels (PDPs), and organic light emitting diode (OLED) displays have been widely used in recent years. Among the flat panel displays, OLED displays are driven at a relatively low voltage, are relatively thin, have a relatively wide viewing angle, and have a relatively quick response speed.

A display panel of the OLED display may include a plurality of pixels arranged in a matrix form. Each of the pixels may include a scan transistor for supplying a data voltage of a data line in response to a scan signal of a scan line and a driving transistor for adjusting the amount of the current supplied to an organic light emitting diode in accordance with a voltage supplied to a gate electrode. The drain-to-source current Ids of the driving transistor supplied to the organic light emitting diode can be expressed according to the following equation:

$$I_{ds} = k \cdot (V_{gs} - V_{th})^2 \qquad (1)$$

where k represents a proportionality coefficient determined by the structure and physical properties of the driving transistor, Vgs represents the gate-source voltage of the driving transistor, and Vth represents the threshold voltage of the driving transistor.

The drain-to-source current Ids of the driving transistor depends upon the threshold voltage Vth of the driving transistor. However, the threshold voltage Vth of the driving transistor may differ (or vary) due to process error (e.g., variability in the manufacturing processes). Alternatively, the threshold voltage Vth of the driving transistor may shift or change as the driving transistor degrades (or ages) over time. Therefore, the threshold voltage Vth of the driving transistor may differ from pixel to pixel. As a result, the luminance of light emitted from each of the pixels may differ even if the same data voltage is supplied to the pixels.

SUMMARY

Aspects of embodiments of the present invention include an organic light emitting display device and a method for driving the same, which may compensate for the threshold voltage of the driving transistor and reduce or minimize the luminance difference between pixels of a display panel.

According to an aspect of an embodiment of the present invention, an organic light emitting display device includes a display panel including data lines, scan lines, a first power voltage line supplying a first power voltage, and a plurality of pixels, a pixel of the plurality pixels including: a driving transistor configured to control an amount of a drain-to-source current flowing from a first electrode of the driving transistor to a second electrode of the driving transistor according to a voltage applied to a gate electrode of the driving transistor; an organic light emitting diode configured to emit light in accordance with the drain-to-source current; and a first transistor having a gate electrode coupled to a scan line of the scan lines, a first electrode coupled to the second electrode of the driving transistor, and a second electrode coupled to the gate electrode of the driving transistor, wherein the first power voltage line is disposed between the second electrode of the first transistor and an anode of the organic light emitting diode.

The scan lines and the gate electrode of the driving transistor may be formed as a first metal pattern, the data lines and the second electrode of the first transistor may be formed as a second metal pattern, the first power voltage line may be formed as a third metal pattern, and wherein the anode of the organic light emitting diode may be formed as a fourth metal pattern.

A length of the first power voltage line along a first direction may be longer than a length of the second electrode of the first transistor along the first direction, and a length of the first power voltage line along a second direction may be longer than a length of the second electrode of the first transistor along the second direction.

The second electrode of the first transistor may be coupled to the gate electrode of the driving transistor through a first contact hole.

The second electrode of the first transistor may be coupled to an active layer of the first transistor through a second contact hole.

The first contact hole may penetrate a plurality of insulator layers and the second contact hole may penetrate a gate insulator and the plurality of insulator layers.

The pixel may further include: a second transistor including a gate electrode coupled to another scan line of the scan lines, a first electrode coupled to the gate electrode of the driving transistor, and a second electrode coupled to the first power voltage line; a third transistor including a gate electrode coupled to the scan line, a first electrode coupled to a data line, and a second electrode coupled to the first electrode of the driving transistor; and a fourth transistor including a gate electrode coupled to the another scan line, a first electrode coupled to the anode of the organic light emitting diode, and a second electrode coupled to the first power voltage line.

The display panel may further include a plurality of emission lines.

The pixel may further include: a fifth transistor including a gate electrode coupled to an emission line of the emission lines, a first electrode coupled to a second power voltage line supplying a second power voltage, and a second electrode coupled to the first electrode of the driving transistor; and a sixth transistor including a gate electrode coupled to the emission line, a first electrode coupled to the second electrode of the driving transistor, and a second electrode coupled to the anode of the organic light emitting diode.

The pixel may further include a capacitor coupled between the gate electrode of the driving transistor and the second power voltage line.

A cathode of the organic light emitting diode may be coupled to a third power voltage line configured to supply a third power voltage.

The display panel may be configured to: supply a scan signal to the scan line, the scan signal having a gate on voltage during a first period, supply another scan signal to the another scan line, the another scan signal having a gate on voltage during a second period, and supply an emission signal to the emission line, the emission signal having a gate on voltage during a third period.

The display panel may be configured to change the second power voltage.

The third power voltage may have a first voltage in a normal mode and a second voltage in a black grayscale mode.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will convey the scope of embodiments of the present invention to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Hereinafter, certain exemplary embodiments according to the present invention will be described with reference to the accompanying drawings. Here, when a first element is described as being coupled to a second element, the first element may be not only directly coupled to the second element but may also be indirectly coupled to the second element via a third element. Further, some of the elements that are not essential to the complete understanding of the invention are omitted for clarity. Also, like reference numerals refer to like elements throughout.

Figure 1:
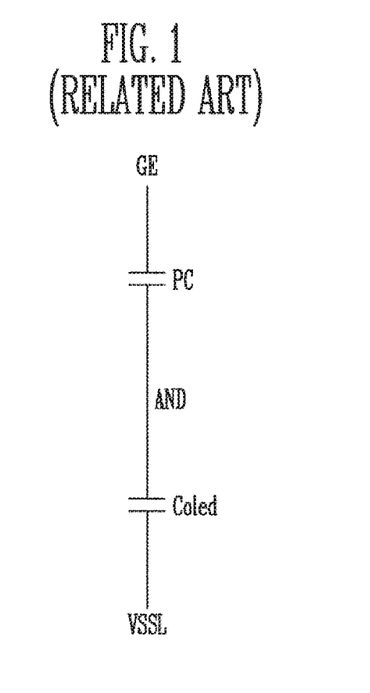
FIG. 1 is a circuit diagram showing an example of a first parasitic capacitance between a gate electrode of a driving transistor and an anode of an organic light emitting diode, and a second parasitic capacitance between the anode of the organic light emitting diode and a low voltage line.

FIG. 1 is a circuit diagram showing an example of a first parasitic capacitance between a gate electrode of a driving transistor and an anode of an organic light emitting diode, and a second parasitic capacitance between the anode of the organic light emitting diode and a low voltage line according to a related art. Referring to FIG. 1, the first parasitic capacitance PC is formed between the gate electrode GE of the driving transistor and the anode AND of the organic light emitting diode. The second parasitic capacitance Coled is formed between the anode AND of the organic light emitting diode and a low power voltage line VSSL supplying a low power voltage.

In some related art, changes are made to the low power voltage to a power consumption of a display panel. In this case, a voltage change of the low power voltage may be applied to the anode AND of the organic light emitting diode through the second parasitic capacitance Coled. Thus, a voltage of the anode AND of the organic light emitting may be changed. Also, a voltage change of the anode AND may be applied to the gate electrode GE of the driving transistor through the first parasitic capacitance PC. Thus, a voltage of the gate electrode GE of the driving transistor may be changed.

Therefore, the voltage of the gate electrode GE of the driving transistor may change through the first and second parasitic capacitances PC and Coled when the low power voltage is changed. As a result, the organic light emitting diode may emit a light (or an amount of light) different from an originally intended light (or amount of light).

The embodiments of the invention may prevent (or reduce) the voltage change of the gate electrode GE of the driving transistor through the first and second parasitic capacitances PC and Coled when the low power voltage is changed. Hereinafter, the embodiments of the invention are described in detail with reference to FIGS. 2, 3, 4, 5, 6, 7A, 7B, 7C, and 8.

Figure 2:
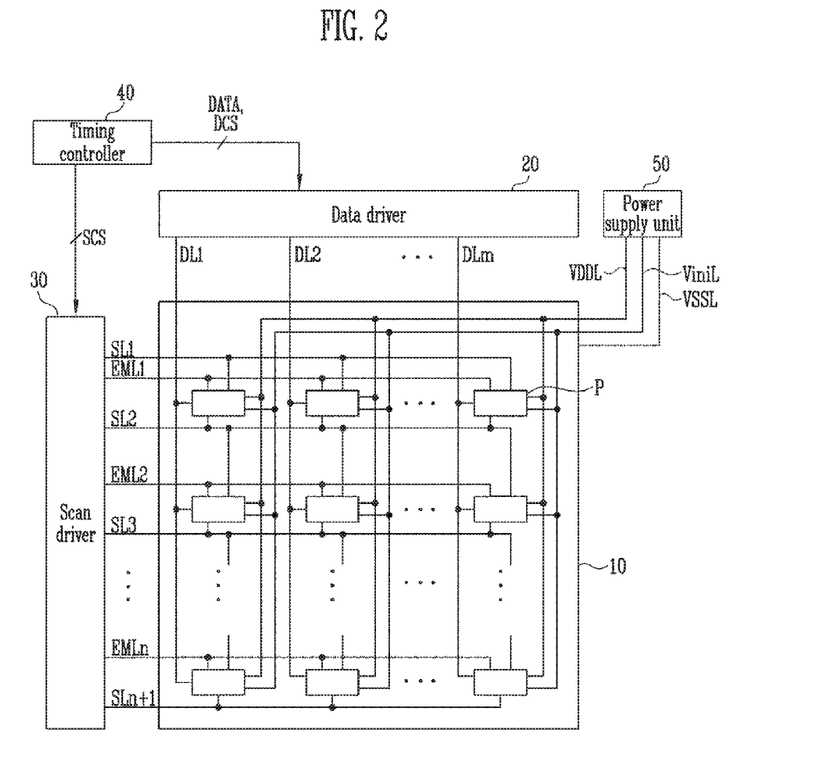
FIG. 2 is a block diagram schematically showing an organic light emitting display device according to an example embodiment of the present invention.

FIG. 2 is a block diagram schematically showing an organic light emitting display device according to one embodiment. Referring to FIG. 2, the organic light emitting display device according to one embodiment includes a display panel 10, a data driver 20, a scan driver 30, a timing controller 40, and a power supply unit 50.

Data lines DL1 to DLm and scan lines SL1 to SLn crossing each other are formed in the display panel 10, wherein m is a positive integer greater than or equal to 2 and n is a positive integer greater than or equal to 2. Also, emission lines EML1 to EMLn may be formed in the display panel. The emission lines EML1 to EMLn may extend along a direction parallel to the scan lines SL1 to SLn. Also, pixels P are arranged in a matrix form in the display panel 10. A pixel P according to one embodiment is described in conjunction with FIG. 3.

The data driver 20 includes at least one source drive IC. The source drive IC receives digital video data DATA from the timing controller 40. The source drive IC converts the digital video data DATA into data voltages in response to a data timing control signal DCS from the timing controller 40. The source drive IC supplies the data voltages to the data lines DL1 to DLm of the display panel 10 in synchronization with scan signals. Therefore, the data voltages are supplied to pixels to which a scan signal is supplied.

The scan driver 30 includes a scan signal output part and an emission signal output part. Each of the scan signal output part and the emission signal output part may have a shift register for sequentially outputting signals, a level shifter for shifting the signals of the shift register to a swing width suitable for transistors of the pixels, a buffer, and the like.

The scan signal output part may sequentially output the scan signals SCAN to the scan lines SL1 to SLn of the display panel 10. The emission signal output part may sequentially output emission signals EM to the emission lines EML1 to EMLn of the display panel 10. The scan signal SCAN and the emission signal EM are described in more detail in conjunction with FIG. 4.

According to one embodiment, the timing controller 40 receives the digital video data DATA from a host system through a low voltage differential signaling (LVDS) interface, a transition minimized differential signaling (TMDS) interface, etc. The timing controller 40 may receive timing signals such as a vertical synchronization signal, a horizontal synchronization signal, a data enable signal, and a dot clock, and may generate timing control signals for controlling operation timings of the data driver 20 and scan driver 30 based on the timing signals. The timing control signals include a scan timing control signal SCS for controlling the operation timing of the scan driver 30 and a data timing control signal DCS for controlling the operation timing of the data driver 20. The timing controller 40 outputs the scan timing control signal SCS to the scan driver 30, and outputs the data timing control signal DCS and the digital video data DATA to the data driver 20.

The power supply unit 50 supplies a first power voltage to the pixels P through first power voltage line ViniL, a second power voltage to the pixels P through the second power voltage line VDDL, and a third power voltage to the pixels P through the third power voltage line VSSL. The first power voltage may be an initialization voltage, the second power voltage may be a high power voltage, and the third power voltage may be a low power voltage. Also, the power supply unit 50 may supply a gate on voltage Von and a gate off voltage Voff to the scan driver 30. The gate on voltage Von refers to a voltage for turning on transistors of the pixels P, and the gate off voltage Voff refers to a voltage for turning off the transistors of the pixels P.

The power supply unit 50 may change the third power voltage to reduce a power consumption of the display panel 10. The timing controller 40 may generate a mode signal and output the mode signal to the power supply unit 50. For example, the timing controller 40 may control the power supply unit 50 to operate in a normal mode when the mode signal has a first logic level voltage and to operate in a black grayscale mode when the mode signal has a second logic level voltage.

The power supply unit 50 may supply the third power voltage depending on the mode signal. For example, the power supply unit 50 may supply the third power voltage as a first voltage in the normal mode. The power supply unit 50 may supply the third power voltage as a second voltage higher than the first voltage in a black grayscale mode in which the pixels P emit light in accordance with a black grayscale (e.g., a grayscale image). The voltage change of the gate electrode of the driving transistor when the third power voltage is changed is described in more detail with reference to FIG. 4.

Figures 3, 4:
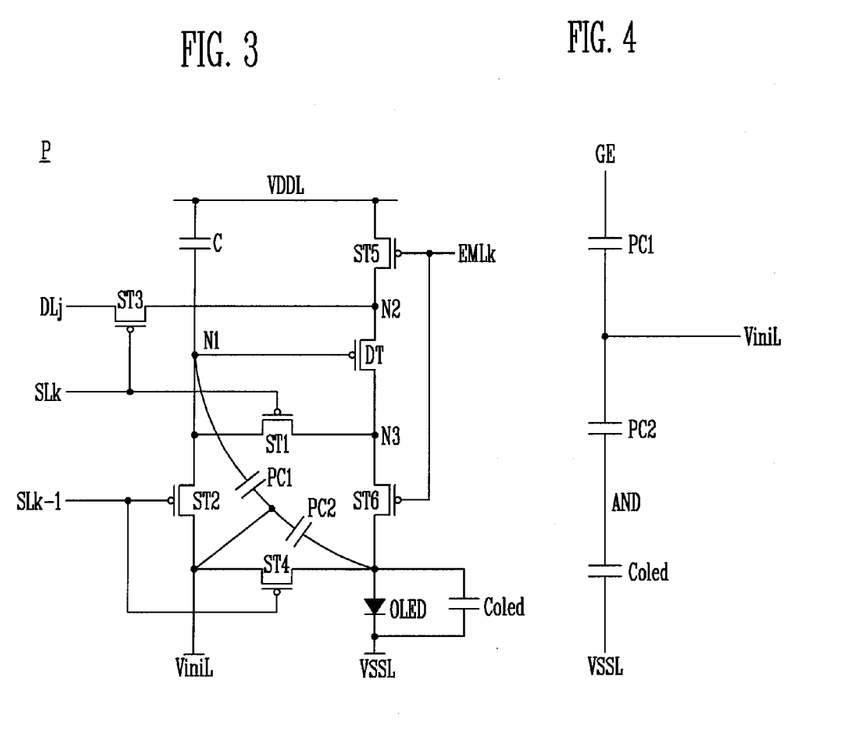
FIG. 3 is an equivalent circuit diagram of a pixel according to an example embodiment of the present invention.
FIG. 4 is a circuit diagram showing an example of a first parasitic capacitance between a gate electrode of a driving transistor and an anode of an organic light emitting diode, and second and third parasitic capacitances between the anode of the organic light emitting diode and a low voltage line according to an example embodiment of the present invention.

FIG. 3 is an equivalent circuit diagram of a pixel according to one embodiment. Referring to FIG. 3, the pixel P according to one embodiment is coupled to a scan line, another scan line, a data line, and an emission line. For example, the pixel P may be coupled to a (k−1)-th scan line SLk−1, a k-th scan line SLk, a k-th emission line EMLk, and a j-th data line DLj, wherein k is a positive integer greater than or equal to 2 and less than or equal to n, and j is a positive integer greater than or equal to 1 and less than or equal to m. Also, the pixel P according to one embodiment is coupled to first, second, and third power voltage lines ViniL, VDDL, and VSSL.

The pixel P according to one embodiment includes a driving transistor DT, an organic light emitting diode OLED, switch elements, and a capacitor C. The switch elements include first, second, third, fourth, fifth, and sixth transistors ST1, ST2, ST3, ST4, ST5, and ST6.

The driving transistor DT controls an amount of drain-to-source current Ids flowing from a first electrode thereof to a second electrode thereof according to a voltage applied to a gate electrode of the driving transistor DT. The drain-to-source current Ids of the driving transistor DT is proportional to the square of a difference between the gate-source voltage Vgs of the driving transistor and the threshold voltage Vth of the driving transistor as described in equation 1 above. A gate electrode of the driving transistor DT is coupled to a first node N1, a first electrode thereof is coupled to a second node N2, and a second electrode thereof is coupled to a third node N3. Here, the first electrode may be a source or a drain electrode, and the second electrode may be a different electrode from the first electrode (e.g., the second electrode may be the drain or the source electrode). For example, if the first electrode is the source electrode, then the second electrode is the drain electrode.

The organic light emitting diode OLED emits light in accordance with the drain-to-source current Ids of the driving transistor (or TFT) DT. The luminance of light emitted by the organic light emitting diode OLED is proportional to the drain-to-source current Ids of the driving transistor DT. An anode of the organic light emitting diode OLED is coupled to a second electrode of the sixth transistor ST6 and a first electrode of the fourth transistor ST4. A cathode of the organic light emitting diode OLED is coupled to the third power voltage line VSSL supplying the third power voltage.

The first transistor ST1 is coupled between the first node N1 and the third node N3. The first transistor ST1 is turned on by the scan signal from the k-th scan line SLk. When the first transistor ST1 is turned on, the first node N1 is coupled to the third node N3, thus the driving transistor DT is diode-coupled. A gate electrode of the first transistor ST1 is coupled to the k-th scan line SLk, a first electrode thereof is coupled to the third node N3, and a second electrode thereof is coupled to the first node N1.

The second transistor ST2 is coupled between the first node N1 and the first power voltage line ViniL supplying the first power voltage. The second transistor ST2 is turned on by a scan signal from the (k−1)-th line SLk−1. When the second transistor ST2 is turned on, the first node N1 is coupled to the first power voltage line ViniL, thus the first node N1 is initialized to the first power voltage. A gate electrode of the second transistor ST2 is coupled to the (k−1)-th scan line SLk−1, a first electrode thereof is coupled to the first node N1, and a second electrode thereof is coupled to the first power voltage line ViniL.

The third transistor ST3 is coupled between the second node N2 and the j-th data line DLj. The third transistor ST3 is turned on by the scan signal from the k-th scan line SLk. When the third transistor ST3 is turned on, the second node N2 is coupled to the data line DL, thus a data voltage Vdata from the j-th data line DLj is supplied to the second node N2. A gate electrode of the third transistor ST3 is coupled to the k-th scan line SLk, a first electrode thereof is coupled to the j-th data line DLj, and a second electrode thereof is coupled to the second node N2.

The fourth transistor ST4 is coupled between the anode of the organic light emitting diode OLED and the first power voltage line ViniL. The fourth transistor ST4 is turned on by the scan signal from the (k−1)-th scan line. When the fourth transistor ST4 is turned on, the anode of the organic light emitting diode OLED is coupled to the first power voltage line ViniL, thus the anode of the organic light emitting diode OLED is initialized to the first power voltage. A gate electrode of the fourth transistor ST4 is coupled to the (k−1)-th scan line SLk−1, a first electrode thereof is coupled to the anode of the organic light emitting diode OLED, and a second electrode thereof is coupled to the first power voltage line ViniL.

The fifth transistor ST5 is coupled between the second node N2 and the second power voltage line VDDL supplying a second power voltage. The fifth transistor ST5 is turned on by an emission signal from the k-th emission line EMLk. When the fifth transistor ST5 is turned on, the second node N2 is coupled to the second power voltage line VDDL, thus the second power voltage is supplied to the second node N2. A gate electrode of the fifth transistor ST5 is coupled to the k-th emission line EMLk, a first electrode thereof is coupled to the second power voltage line VDDL, and a second electrode thereof is coupled to the second node N2.

The sixth transistor ST6 is coupled between the third node N3 and the anode of the organic light emitting diode OLED. The sixth transistor ST6 is turned on by the emission signal from the k-th emission line EMLk. When the sixth transistor ST6 is turned on, the third node N3 is coupled to the anode of the organic light emitting diode OLED. A gate electrode of the sixth transistor ST6 is coupled to the k-th emission line EMLk, a first electrode thereof is coupled to the third node N3, and a second electrode thereof is coupled to the anode of the organic light emitting diode OLED. When the fifth and sixth transistors are turned-on, the drain-to-source current Ids of the driving transistor DT is supplied to the organic light emitting diode OLED.

The capacitor C is formed between the first node N1 and the second power voltage line VDDL. The capacitor C may store a difference voltage between a voltage of the first node N1 and the second power voltage.

A first parasitic capacitance PC1 is formed between the gate electrode of the driving transistor DT and the first power voltage line ViniL. A second parasitic capacitance PC2 is formed between the anode AND of the organic light emitting diode and the first power voltage line ViniL. A third parasitic capacitance Coled is formed between the anode AND of the organic light emitting diode and the third power voltage line VSSL.

The first node N1 is a gate node coupled to the gate electrode of the driving transistor DT. The first node N1 is a contact point at which the gate electrode of the driving transistor DT, the second electrode of the first transistor ST1 and the first electrode of the second transistor ST2 are each mutually electrically coupled. The second node N2 is a source node coupled to the first electrode of the driving transistor DT. The second node N2 is a contact point at which the first electrode of the driving transistor DT, the second electrode of the third transistor ST3, and the second electrode of the fifth transistor ST5 are each mutually electrically coupled. The third node N3 is a drain node coupled to the second electrode of the driving transistor DT. The third node N3 is a contact point at which the second electrode of the driving transistor DT, the first electrode of the first transistor ST1, and the first electrode of the sixth transistor ST6 are each mutually electrically coupled.

Active layers of the first, second, third, fourth, fifth, and sixth transistors ST1, ST2, ST3, ST4, ST5, and ST6 and the driving transistor DT have been described as being formed of Poly-Si by a low temperature Poly-Si (LTPS) process. The active layers refer to semiconductor layers. However, the embodiments are not limited thereto, and the active layers of the first, second, third, fourth, fifth, and sixth transistors ST1, ST2, ST3, ST4, ST5, and ST6 and the driving transistor DT may be formed of either a-Si or an oxide semiconductor, or other suitable semiconductor material.

Also, one embodiment has been described in which the first, second, third, fourth, fifth, and sixth transistors ST1, ST2, ST3, ST4, ST5, and ST6 and the driving transistor DT are implemented as P-type transistors. However, embodiments of the present invention are not limited thereto, and the first, second, third, fourth, fifth, and sixth transistors ST1, ST2, ST3, ST4, ST5, and ST6 and the driving transistor DT may be implemented as N-type transistors. When the first, second, third, fourth, fifth, and sixth transistors ST1, ST2, ST3, ST4, ST5, and ST6 and the driving transistor DT are implemented as N-type transistors, a waveform diagram shown in FIG. 5 may be modified in accordance with the characteristics of the N-type transistors.

The first, second, and third power voltages are set after consideration of the characteristics of the driving transistor DT and the first, second, third, fourth, fifth, and sixth transistors ST1, ST2, ST3, ST4, ST5, and ST6, the characteristics of the organic light emitting diode OLED, and so on.

In addition, according to one embodiment the third power voltage may be changed to reduce a power consumption of the display panel. For example, one embodiment may supply the third power voltage as a first voltage in the normal mode and supply the third power voltage as a second voltage higher than the first voltage in a black grayscale mode. The voltage change of the gate electrode of the driving transistor when the third power voltage is changed is described in more detail with reference to FIG. 4.

FIG. 4 is a circuit diagram showing an example of first and second parasitic capacitances between a gate electrode of a driving transistor and an anode of an organic light emitting diode, and a third parasitic capacitance between the anode of the organic light emitting diode and a low voltage line according to one embodiment. Referring to FIG. 4, the first parasitic capacitance PC1 is formed between the gate electrode GE of the driving transistor and the first power voltage line ViniL. The second parasitic capacitance PC2 is formed between the anode AND of the organic light emitting diode and the first power voltage line ViniL. The third parasitic capacitance Coled is formed between the anode AND of the organic light emitting diode and the third power voltage line VSSL.

When the third power voltage is changed, a voltage change of the third power voltage may be applied to the anode AND of the organic light emitting diode through the third parasitic capacitance Coled. Thus, a voltage of the anode AND of the organic light emitting may be changed. However, the first power voltage is not influenced by the voltage change of the anode AND of the organic light emitting diode because the first power voltage is a direct current (DC) voltage. Therefore, the voltage of the gate electrode GE of the driving transistor is not influenced by the voltage change of the anode AND of the organic light emitting diode. As a result, one embodiment may prevent or reduce the voltage change of the gate electrode GE of the driving transistor due to the parasitic capacitances of the pixel P when the third power voltage (e.g., the voltage supplied to third voltage power line VSSL) is changed.

Figure 5:
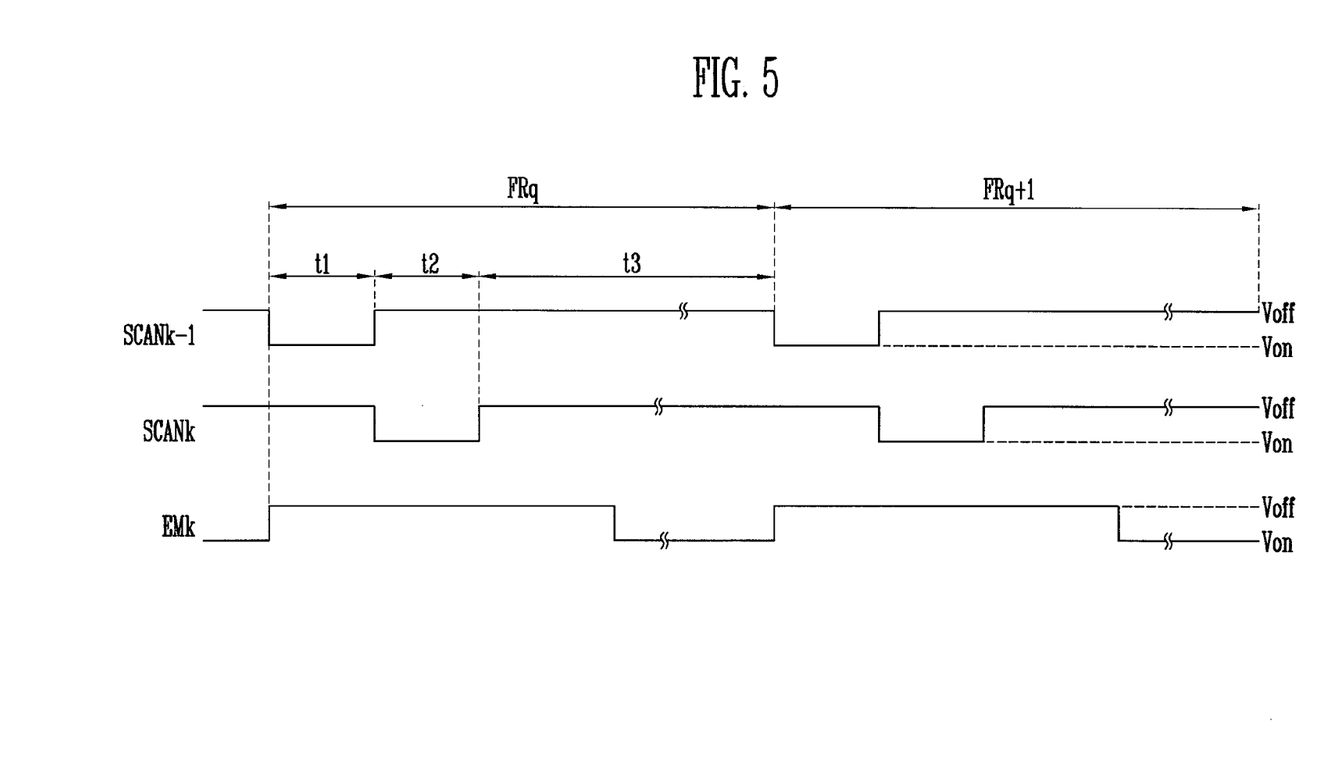
FIG. 5 is a waveform diagram showing signals which, according to one embodiment of the present invention, are input into a pixel of FIG. 3.

FIG. 5 is a waveform diagram showing signals which are input into a pixel of FIG. 3. FIG. 5 depicts a (k−1)-th scan signal SCANk−1 of the (k−1)-th scan line SLk−1, a k-th scan signal SCANk of the k-th scan line SLk, and a k-th emission signal EMk of the k-th emission line EMLk during q-th and (q+1)-th frame periods FRq and FRq+1, wherein q is a positive integer.

Referring to FIG. 5, the (k−1)-th scan signal SCANk−1 is for controlling the second and fourth transistors ST2 and ST4, the k-th scan signal SCANk is for controlling the first and third transistors ST1 and ST3, and the k-th emission signal EMk is for controlling the fifth and sixth transistors ST5 and ST6. Each scan signal and each emission signal may have a cycle of one frame period.

Each scan signal may have the gate on voltage Von during one horizontal period. One horizontal period refers to a period that supplies data voltages to pixels arranged on a horizontal line. Here, the pixels arranged on a horizontal line refer to pixels coupled to one scan line. The data voltages are supplied in synchronized with the gate on voltage Von of each scan signal.

One frame period includes first, second, and third periods t1, t2, and t3. The first period t1 is a period that initializes the gate electrode of the driving transistor DT and the anode of the organic light emitting diode OLED. The second period t2 is a period that supplies a data voltage to the first node N1 and senses a threshold voltage of the driving transistor DT. The third period t3 is a period that emits light from an organic light emitting diode OLED depending on the drain-to-source current Ids of the driving transistor DT.

The (k−1)-th scan signal SCANk−1 may have the gate on voltage Von during the first period t1 and the gate off voltage Voff during the second and third periods t2 and t3. The k-th scan signal SCANk may have the gate on voltage Von during the second period t2 and the gate off voltage Voff during the first and third periods t1 and t3. The k-th emission signal may have the gate on voltage Von during the third period t3 and the gate off voltage Voff during the first and second periods t1 and t2. The gate on voltage Von refers to a voltage for turning on first, second, third, fourth, fifth, and sixth transistors ST1, ST2, ST3, ST4, ST5, and ST6, and the gate off voltage Voff refers to a voltage for turning off the first, second, third, fourth, fifth, and sixth transistors ST1, ST2, ST3, ST4, ST5, and ST6.

Figure 6:
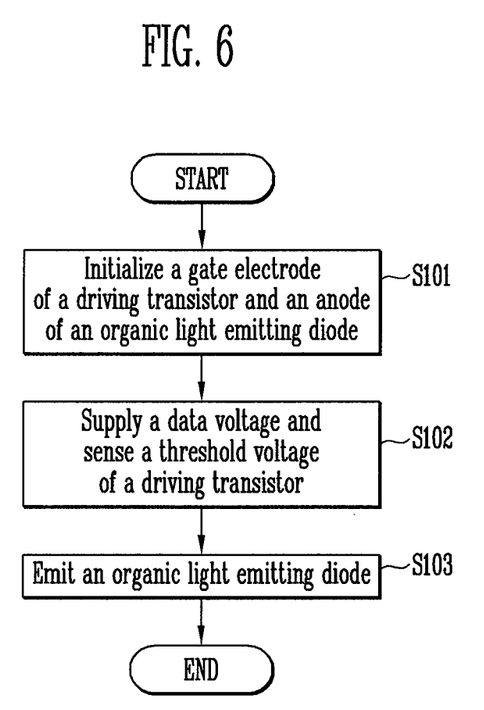
FIG. 6 is a flow chart illustrating a method for driving a pixel of FIG. 3 according to one embodiment of the present invention.
Figure 7A:
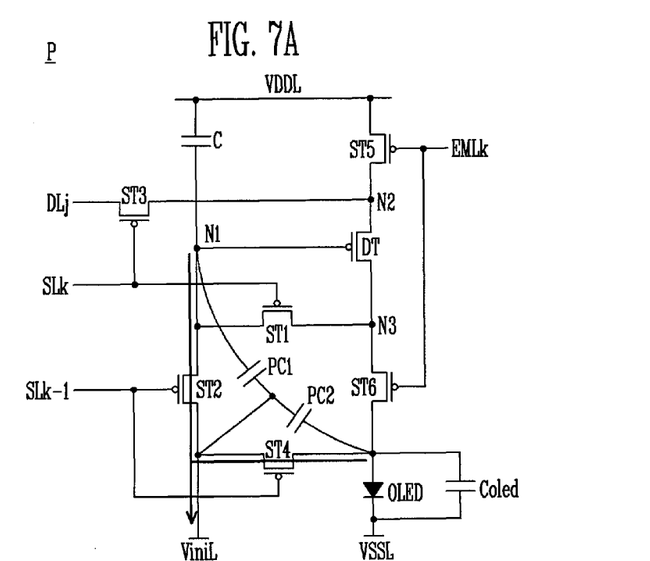
FIGS. 7A, 7B, and 7C are circuit diagrams of a pixel of FIG. 3 during first, second, and third periods according to one embodiment of the present invention.
Figure 7B:
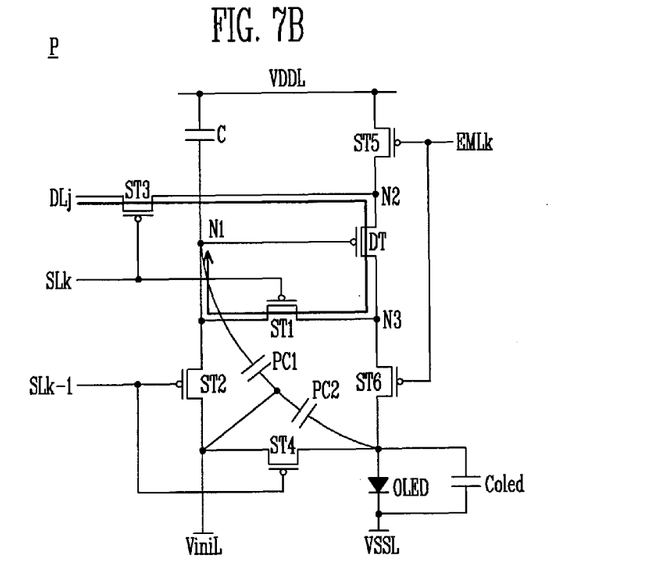
Figure 7C:
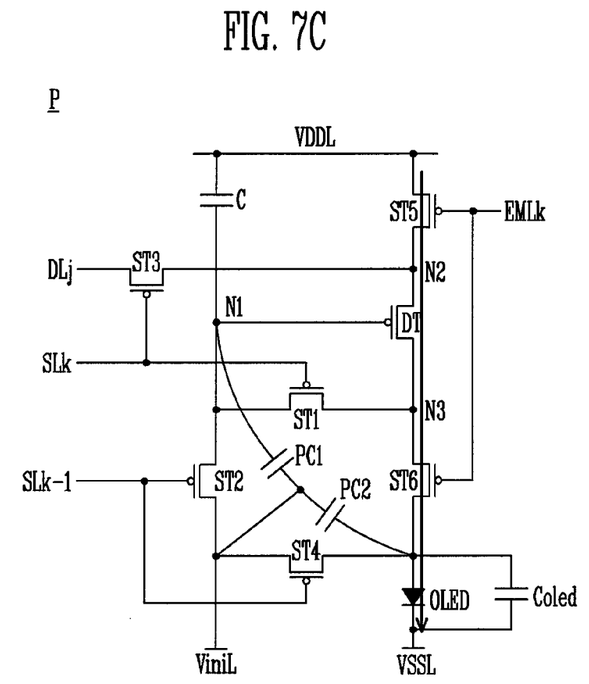

FIG. 6 is a flow chart illustrating a method for driving a pixel of FIG. 3. FIGS. 7A, 7B, and 7C are circuit diagrams of a pixel of FIG. 3 during first, second, and third periods. The method for driving the pixel P of FIG. 3 during the first, second, and third periods t1, t2, and t3 is described in detail in conjunction with FIGS. 5, 6 7A, 7B, and 7C.

First, as shown in FIG. 5, during the first period t1, the (k−1)-th scan signal SCANk−1 having the gate on voltage Von is supplied to the pixel P. The k-th scan signal SCANk having the gate off voltage Voff and the k-th emission signal EMk having the gate off voltage Voff are supplied to the pixel P during the first period t1.

Referring to FIG. 7A, the second and fourth transistors ST2 and ST4 are turned on by the (k−1)-th scan signal SCANk−1 having the gate on voltage Von. The first and third transistors ST1 and ST3 are turned off by the k-th scan signal SCANk having the gate off voltage Voff. The fifth and sixth transistors ST5 and ST6 are turned off by the k-th emission signal EMk having the gate off voltage Voff.

The first node N1 is initialized to the first power voltage of the first power voltage line ViniL because the second transistor ST2 is turned on during the first period t1. Also, the anode of the organic light emitting diode OLED is initialized to the first power voltage of the first power voltage line ViniL because the fourth transistor ST4 is turned on during the first period t1. The first power voltage may be substantially same as the third power voltage to prevent the organic light emitting diode OLED from emitting light. (See S101 in FIG. 6)

Second, as shown in FIG. 5, during the second period t2, the k-th scan signal SCANk having the gate on voltage Von is supplied to the pixel P. The (k−1)-th scan signal SCANk−1 having the gate off voltage Voff and the k-th emission signal EMk having the gate off voltage Voff are supplied to the pixel P during the second period t2.

Referring to FIG. 7B, the first and third transistors ST1 and ST3 are turned on by the k-th scan signal SCANk having the gate on voltage Von. The second and fourth transistors ST2 and ST4 are turned off by the (k−1)-th scan signal SCANk−1 having the gate off voltage Voff. The fifth and sixth transistors ST5 and ST6 are turned off by the k-th emission signal EMk having the gate off voltage Voff.

The first node N1 is electrically coupled to the third node N3 because the first transistor ST1 is turned on, thus the driving transistor DT is diode-coupled. Also, the second node N2 is electrically coupled to the j-th data line DLj because the third transistor ST3 is turned on, thus a data voltage of the j-th data line DLj is supplied to the second node N2.

The drain-to-source current Ids of the driving transistor DT flows until the gate-source voltage of the driving transistor DT reaches the threshold voltage of the driving transistor DT because the gate-source voltage "Vini-Vdata" is less than the threshold voltage of the driving transistor DT. Therefore, the voltage of the first node N1 rises up to "Vdata+Vth". The voltage "Vdata+Vth" of the first node N1 is stored in the capacitor C. For example, the threshold voltage of the driving transistor DT may be sensed by the capacitor C during the second period t2. Vini refers to the first power voltage and Vdata refers to the data voltage and Vth refers to the threshold voltage of the driving transistor DT. (See S102 in FIG. 6)

Third, as shown in FIG. 5, during the third period t3, the k-th emission signal EMk having the gate on voltage Von are supplied to the pixel P. The (k−1)-th scan signal SCANk−1 having the gate off voltage Voff and the k-th scan signal SCANk having the gate off voltage Voff are supplied to the pixel P during the third period t3.

Referring to FIG. 7C, the fifth and sixth transistors ST5 and ST6 are turned on by the k-th emission signal EMk having the gate on voltage Von. The second and fourth transistors ST2 and ST4 are turned off by the (k−1)-th scan signal SCANk−1 having the gate off voltage Voff. The first and third transistors ST1 and ST3 are turned off by the k-th scan signal SCANk having the gate off voltage Voff.

The second node N2 is electrically coupled to the second power voltage line VDDL because the fifth transistor ST5 is turned on. The third node N3 is electrically coupled to the anode of the organic light emitting diode OLED because the sixth transistor ST6 is turned on. Therefore, the drain-to-source current Ids of the driving transistor DT is supplied to the organic light emitting diode OLED. Because the voltage "Vdata+Vth" of the first node N1 is stored to the capacitor C, the drain-to-source current Ids of the driving transistor DT is expressed in following equation:

$$I_{ds}=k'\cdot(V_{gs}-V_{th})_2=k'\cdot((V\text{data}+Vth)-ELVDD-Vth)^2 \quad (2)$$

where k' represents a proportionality coefficient determined by the structure and physical properties of the driving transistor DT, Vgs represents the gate-source voltage of the driving transistor DT, Vth represents the threshold voltage of the driving transistor DT, Vdata represents the data voltage, and ELVDD (also referred to as Vdd) represents the second power voltage. The gate voltage Vg of the driving transistor DT is Vdata+Vth, and the source voltage Vs of the driving transistor DT is ELVDD (also referred to as Vdd) during the third period t3. To sum up equation 2, the drain-to-source current Ids of the driving transistor DT is derived as expressed in the following equation:

$$I_{ds}=k'\cdot(V\text{data}-ELVDD)^2 \quad (3)$$

Therefore, the drain-to-source current Ids does not depend on the threshold voltage of the driving transistor DT as in equation 3. Therefore, one embodiment of the present invention may compensate the threshold voltage Vth of the driving transistor DT. (See S103 in FIG. 6)

Accordingly, one embodiment may compensate the threshold voltage Vth of the driving transistor DT. As a result, one embodiment may reduce or minimize the luminance difference between pixels of a display panel because the drain-to-source current Ids does not depend on the threshold voltage of the driving transistor DT.

Figure 8:
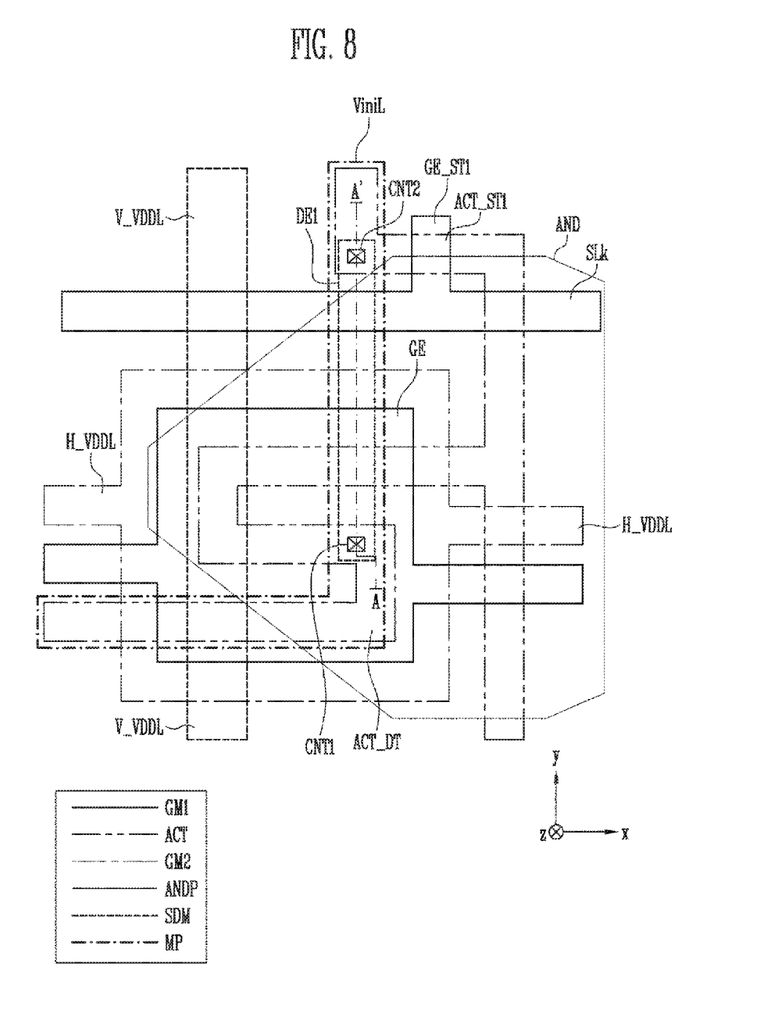
FIG. 8 is a plan view illustrating an example of a driving transistor and a first transistor of FIG. 3 according to one embodiment of the present invention.
Figure 9:
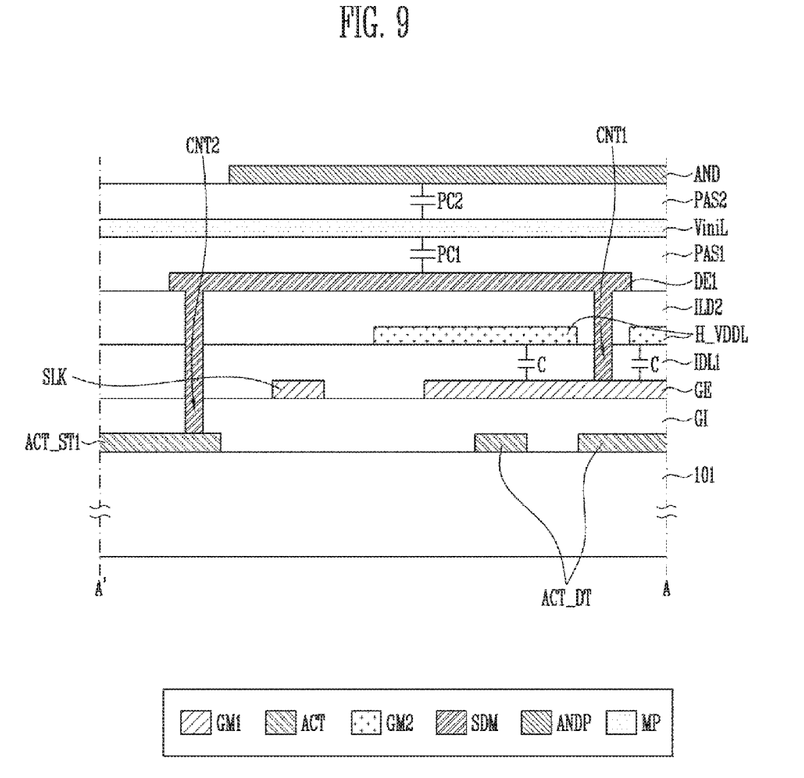
FIG. 9 is a cross-sectional diagram along A-A' of FIG. 8 according to one embodiment of the present invention.

FIG. 8 is a plan view illustrating an example of a driving transistor and a first transistor of FIG. 3. FIG. 9 is a cross-sectional diagram of A-A' of FIG. 8. Hereinafter, the connection of a gate electrode GE of the driving transistor DT, a second electrode DE1 of the first transistor ST1 and an active layer ACT_ST1 of the first transistor ST1 is described in detail with reference to FIGS. 8 and 9.

Referring to FIGS. 8 and 9, an active pattern ACT including an active layer ACT_DT of the driving transistor DT and the active layer ACT_ST1 of the first transistor ST1 is formed on a lower substrate 101 of the display panel 10. Alternatively, the active pattern ACT may be formed on a buffer layer on the lower substrate 101. The active pattern ACT may be formed of one of a poly-silicon, a-Si, and oxide, and the like.

A gate insulator GI is formed on the active pattern ACT. The gate insulator GI may be formed of SiNx (silicon nitride).

A first gate metal pattern GM1 including the gate electrode GE of the driving transistor DT, a k-th scan line SLk and a gate electrode GE_ST1 of the first transistor ST1 is formed on the gate insulator GI. The first gate metal pattern GM1 is isolated from the active pattern ACT by the gate insulator GI. The first metal pattern GM1 may be formed of Mo (molybdenum).

A first layer insulator ILD1 is formed on the first gate metal pattern GM1. The first layer insulator ILD1 may be formed of SiNx (silicon nitride).

A second gate metal pattern GM2 including a horizontal second power voltage line H_VDDL is formed on the first layer insulator ILD1. The second gate metal pattern GM2 is isolated from the first gate metal pattern GM1 by the first layer insulator ILD1.

A second layer insulator ILD2 is formed on the second gate metal pattern GM2. The second layer insulator ILD2 may be formed as a double layer having a SiNx (silicon nitride) layer and a $SiO_2$ (silicon dioxide) layer.

A source/drain metal pattern SDM including a vertical second power voltage line V_VDDL and the second electrode DE1 of the first transistor ST1 is formed on the second layer insulator ILD2. The source/drain metal pattern SDM is isolated from the second gate metal pattern GM2 by the second layer insulator ILD2. The source/drain metal pattern SDM may be formed as a triple layer having a Ti (Titanium) layer, an Al (Aluminum) layer, and a Ti (Titanium) layer.

In addition, the second electrode DE1 of the first transistor ST1 is coupled to the gate electrode GE of the driving transistor DT through a first contact hole CNT1. The first contact hole CNT1 penetrates the first and second layer insulators ILD1 and ILD2 to expose the gate electrode GE of the driving transistor DT.

Also, the second electrode DE1 of the first transistor ST1 is coupled to the active layer ACT_ST1 of the first transistor ST1 through a second contact hole CNT2. The second contact hole CNT2 penetrates the gate insulator GI, the first and second layer insulators ILD1 and ILD2 to expose the active layer ACT_ST1 of the first transistor ST1.

Moreover, the second power voltage line VDDL includes the horizontal second power voltage line H_VDDL and the vertical second power voltage line V_VDDL. The horizontal second power voltage line H_VDDL may be parallel to a horizontal direction (x-axis direction). The vertical second power voltage line V_VDDL may be parallel to a vertical direction (y-axis direction). The horizontal second power voltage line H_VDDL may be coupled to the vertical second power voltage line V_VDDL through a third contact hole (not shown). The third contact hole penetrates the second layer insulator IDL2 for exposing the horizontal second power voltage line H_VDDL. Also, the overlapped area between the horizontal second power voltage line H_VDDL and the gate electrode GE of the driving transistor DT functions as the capacitor C.

A first passivation layer PAS1 is formed on the source/drain metal pattern SDM. According to one embodiment, the first passivation layer PAS1 is formed of polyimide.

A metal pattern MP including the first power voltage line ViniL is formed on the first passivation layer PAS1. The metal pattern MP is isolated from the source/drain metal pattern SDM by the first passivation layer PAS1. The overlapped area between the first power voltage line ViniL and the second electrode DE1 of the first transistor ST1 functions as the first parasitic capacitance PC1.

Furthermore, a horizontal direction (x-axis direction) length of the first power voltage line ViniL is longer than a horizontal direction (x-axis direction) length of the second electrode DE1 of the first transistor ST1. Also, a vertical direction (y-axis direction) length of the first power voltage line ViniL is longer than a vertical direction (y-axis direction) length of the second electrode DE1 of the first transistor ST1. As a result, an electrical coupling such as a parasitic capacitance may not be formed or may be reduced between the anode AND of the organic light emitting diode OLED and the second electrode DE1 of the first transistor ST1.

A second passivation layer PAS2 is formed on the metal pattern MP. According to one embodiment, the second passivation layer PAS2 is formed of polyimide.

An anode pattern ANDP including the anode of the organic light emitting diode OLED is formed on the second passivation layer PAS2. The anode pattern ANDP is isolated from the metal pattern MP by the second passivation layer PAS2. The anode pattern ANDP may be formed as a triple layer having an ITO (indium tin oxide) layer, an Ag (silver) layer, and an ITO (indium tin oxide) layer. The overlapped area between the first power voltage line ViniL and the anode AND of the organic light emitting diode OLED functions as the second parasitic capacitance PC2.

As described above with reference to FIGS. 3, 4, 7A, 7B, 7C, and 8, one embodiment may dispose the first power voltage line ViniL supplying the first power voltage corresponding to a direct current voltage between the anode AND of the organic light emitting diode OLED and the second electrode DE1 of the first transistor ST1. As a result, one embodiment may form the second parasitic capacitance PC2 between the anode AND of the organic light emitting diode OLED and the first power voltage line ViniL, and the first parasitic capacitance PC1 between the second electrode DE1 of the first transistor ST1 and the first power voltage line ViniL. As such, one embodiment may prevent or reduce an electrical coupling such as a parasitic capacitance formed between the anode AND of the organic light emitting diode OLED and the second electrode DE1 of the first transistor ST1.

One embodiment may reduce or prevent the voltage of the gate electrode GE of the driving transistor DT from changing even though the anode AND of the organic light emitting diode OLED is changed due to the third parasitic capacitances Coled when the third power voltage is changed. As such, one embodiment may reduce or prevent the voltage of the gate electrode GE of the driving transistor DT from changing by parasitic capacitances when the third power voltage is changed.

Example embodiments have been disclosed herein, and although specific terms are employed, they are used and are to be interpreted in a generic and descriptive sense only and not for purpose of limitation. In some instances, as would be apparent to one of ordinary skill in the art at the time of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims and equivalents thereof.

What is claimed is:
1. An organic light emitting display device, comprising:
  a display panel comprising data lines, scan lines, and a plurality of pixels, a pixel of the plurality of pixels comprising:
    a driving transistor having a gate electrode;
    an insulator layer disposed on the gate electrode of the driving transistor;
    an electrode disposed on the insulator layer and coupled to the gate electrode of the driving transistor through a first contact hole;
    a first passivation layer disposed on the electrode;
    a first voltage line disposed on the first passivation layer and configured to supply a first voltage;
    a second passivation layer disposed on the first voltage line; and
    an organic light emitting diode having an anode coupled to the driving transistor,
  wherein the anode is disposed on the second passivation layer, and
  wherein the first voltage line overlaps with the electrode and the anode.
2. The organic light emitting display device of claim 1, wherein the scan lines and the gate electrode of the driving transistor are formed as a first metal pattern,
  wherein is formed as a second metal pattern,
  wherein the first voltage line is formed as a third metal pattern, and
  wherein the anode of the organic light emitting diode is formed as a fourth metal pattern.
3. The organic light emitting display device of claim 1, wherein a length of the first voltage line along a first direction is longer than a length of the electrode along the first direction, and
  wherein a length of the first voltage line along a second direction is longer than a length of the electrode along the second direction.
4. The organic light emitting display device of claim 1, wherein the pixel further comprises:
  a first transistor having a gate electrode coupled to a scan line of the scan lines, a first electrode coupled to a second electrode of the driving transistor, and a second electrode coupled to the gate electrode of the driving transistor,
  wherein the electrode is the second electrode of the first transistor.
5. The organic light emitting display device of claim 4, wherein the second electrode of the first transistor is coupled to an active layer of the first transistor through a second contact hole.
6. The organic light emitting display device of claim 5, wherein the first contact hole penetrates a plurality of insulator layers and the second contact hole penetrates a gate insulator and the plurality of insulator layers.
7. The organic light emitting display device of claim 1, wherein the pixel further comprises:
  a second transistor including a gate electrode coupled to another scan line of the scan lines, a first electrode coupled to the gate electrode of the driving transistor, and a second electrode coupled to the first voltage line;
  a third transistor including a gate electrode coupled to the scan line, a first electrode coupled to a data line, and a second electrode coupled to a first electrode of the driving transistor; and
  a fourth transistor including a gate electrode coupled to the another scan line, a first electrode coupled to the anode of the organic light emitting diode, and a second electrode coupled to the first voltage line.
8. The organic light emitting display device of claim 7, wherein the display panel further comprises a plurality of emission lines.
9. The organic light emitting display device of claim 8, wherein the pixel further comprises:
  a fifth transistor including a gate electrode coupled to an emission line of the emission lines, a first electrode coupled to a second voltage line supplying a second voltage, and a second electrode coupled to the first electrode of the driving transistor; and
  a sixth transistor including a gate electrode coupled to the emission line, a first electrode coupled to a second electrode of the driving transistor, and a second electrode coupled to the anode of the organic light emitting diode.
10. The organic light emitting display device of claim 9, wherein the pixel further comprises a capacitor coupled between the gate electrode of the driving transistor and the second voltage line.
11. The organic light emitting display device of claim 10, wherein a cathode of the organic light emitting diode is coupled to a third voltage line configured to supply a third voltage.
12. The organic light emitting display device of claim 10, wherein the display panel is configured to:

supply a scan signal to the scan line, the scan signal having a gate on voltage during a first period, supply another scan signal to the another scan line, the another scan signal having a gate on voltage during a second period, and supply an emission signal to the emission line, the emission signal having a gate on voltage during a third period.

13. The organic light emitting display device of claim 11, wherein the display panel is configured to change the second voltage.

14. The organic light emitting display device of claim 13, wherein the third voltage has a first value in a normal mode and a second value in a black grayscale mode.

* * * * *